United States Patent
Ng et al.

(10) Patent No.: US 6,730,573 B1
(45) Date of Patent: May 4, 2004

(54) MIM AND METAL RESISTOR FORMATION AT CU BEOL USING ONLY ONE EXTRA MASK

(75) Inventors: Chit Hwei Ng, Singapore (SG); Chaw Sing Ho, Singapore (SG); Lup San Leong, Singapore (SG); Shao Kai, Shanghai (CN); Raymond Jacob Joy, Singapore (SG); Sanford Chu, Singapore (SG); Sajan Marokkey Raphael, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 19 days.

(21) Appl. No.: 10/286,257

(22) Filed: Nov. 1, 2002

(51) Int. Cl.[7] ............................................... H01L 21/20
(52) U.S. Cl. ....................... 438/381; 438/239; 438/240; 438/384; 438/687; 438/396; 438/393
(58) Field of Search .................... 438/381, 384, 438/393, 396, 309, 329, 330, 397, 382, 238, 239, 240, 687

(56) References Cited

U.S. PATENT DOCUMENTS

| | | | |
|---|---|---|---|
| 6,083,785 A | | 7/2000 | Segawa et al. ............. 438/238 |
| 6,271,084 B1 | | 8/2001 | Tu et al. ...................... 438/253 |
| 6,284,590 B1 | | 9/2001 | Cha et al. .................... 438/240 |
| 6,284,619 B1 | | 9/2001 | Seymour et al. ............ 438/396 |
| 6,313,003 B1 | * | 11/2001 | Chen ........................... 438/396 |
| 6,329,234 B1 | * | 12/2001 | Ma et al. ..................... 438/210 |
| 6,500,724 B1 | * | 12/2002 | Zurcher et al. .............. 438/384 |
| 6,534,374 B2 | * | 3/2003 | Johnson et al. ............. 438/381 |
| 6,645,810 B2 | * | 11/2003 | Ng et al. ..................... 438/253 |
| 6,670,237 B1 | * | 12/2003 | Loh et al. .................... 438/253 |

* cited by examiner

Primary Examiner—Maria Guerrero
(74) Attorney, Agent, or Firm—George O. Saile; Rosemary L. S. Pike

(57) ABSTRACT

An improved process for fabricating simultaneously high capacitance, less than 0.13 micron metal-insulator-metal capacitors, metal resistors and metal interconnects, has been developed using single or dual damascene processing. The key advantage is the use of only one additional mask reticle to form both MIM capacitor and resistor, simultaneously. Several current obstacles that exist in BEOL, back end of line, are overcome, namely: (a) the use of two or more photo-masks to make <0.13 um MIM capacitors, (b) undulated copper surfaces, when dielectrics are deposited directly upon it, (c) particles generation concerns during etching, when attempting an etch stop on the bottom MIM plate layers, and finally, (d) dishing during CMP occurs when large copper MIM plates are required, with subsequent capacitance matching problems. The integrated method overcomes the above obstacles and simultaneously forms MIM capacitors, metal resistors and metal interconnects using damascene processing. In addition, the method of forming the MIM capacitors, described herein, can also be used to form anti-fuse devices, in field-programmable gate arrays, FPGA.

31 Claims, 6 Drawing Sheets

MIM AND METAL RESISTOR FORMATION AT CU BEOL USING ONLY ONE EXTRA MASK

BACKGROUND OF THE INVENTION (1) Field of the Invention

This invention relates to a method of fabrication used for semiconductor integrated circuit devices, and more specifically to the formation of high capacitance, less than 0.13 micron metal-insulator-metal capacitors, metal resistors and metal interconnects, formed simultaneously using only one additional mask reticle to form both MIM capacitor and resistor, simultaneously.

(2) Description of Related Art

In this section a description of related Prior Art background patents follows.

U.S. Pat. No. 6,083,785 entitled "Method Of Manufacturing Semiconductor Device Having Resistor Film" granted Jul. 4, 2000 to Segawa et al. shows a MIM capacitor process with spacer over a resistor. An isolation is formed in a part of a P-well of a semiconductor substrate. A resistor film as a first conductor member is formed on the isolation. An insulating film covering the resistor film, except for contact formation regions and an upper electrode film as a second conductor member, are formed simultaneously with the formation of a gate-electrode and a gate oxide film. Silicide films of a refractory metal are formed on the respective surfaces of the gate electrode, N-type high-concentration diffusion layers, the contact formation regions of the resistor film, and the upper electrode film. By utilizing a salicide process, a resistor and an inductor each occupying a small area can be formed without lowering the resistance of the resistor film.

U.S. Pat. No. 6,284,590 entitled "Method To Eliminate Top Metal Corner Shaping During Bottom Metal Patterning For MIM Capacitors" granted Sep. 4, 2001 to Cha et al. describes a MIM capacitor process for fabricating a metal-insulator-metal capacitor wherein top metal corner shaping during patterning is eliminated. An insulating layer is provided overlying a semiconductor substrate. A first metal layer is deposited over the insulating layer. A capacitor dielectric layer is deposited overlying the first metal layer. A second metal layer is deposited overlying the capacitor dielectric layer and patterned to form a top metal electrode. A flowable material layer is deposited overlying the capacitor dielectric and the top metal electrode, and this flowable material is anisotropically etched away to leave spacers on sidewalls of the top metal electrode. A photoresist mask is formed overlying the capacitor dielectric and the top metal electrode wherein the spacers provide extra photoresist thickness at the sidewalls of the top metal layer. The capacitor dielectric layer and the first metal layer are patterned wherein the patterned first metal layer forms a bottom metal electrode and wherein the spacers protect the top metal layer from etching during the patterning. The photoresist mask is removed, completing fabrication of a metal-insulator-metal capacitor.

U.S. Pat. No. 6,284,619 B1 entitled "Integration Scheme For Multilevel Metallization Structures" granted Sep. 4, 2001 to Seymour et al. reveals a scheme for multilevel metallization structures that improve semiconductor reliability. Multilevel metallization structures are formed through a two-step etch process which alleviates the problem of conductive etch residue forming between metal layers in multilevel structures. The resulting metallization structure has sidewall insulators on selected layers that prevent conductive etch residue from forming between the metal layers.

U.S. Pat. No. 6,271,084 B1 entitled "Method Of Fabricating A Metal-Insulator-Metal (MIM), Capacitor Structure Using A Damascene Process" granted Aug. 7, 2001 to Tu et al. describes a MIM capacitor using a damascene process for forming a vertical, metal-insulator-metal (MIM), capacitor structure, for embedded DRAM devices. The process features forming a capacitor opening in a composite insulator layer comprised of a overlying insulator stop layer, a low k insulator layer, and an underlying insulator stop layer, with a lateral recess isotropically formed in the low k insulator layer. After formation of a bottom electrode structure in the capacitor opening, a high k insulator layer is deposited followed by the deposition of a conductive layer, completely filling the capacitor opening. A chemical mechanical polishing procedure is then used to remove portions of the conductive layer, and portions of the high k insulator layer, from the top surface of the overlying insulator stop layer, resulting in the formation of the vertical MIM capacitor structure, in the capacitor opening, comprised of: a top electrode structure, defined from the conductive layer; a capacitor dielectric layer, formed from the high k insulator layer; and a bottom electrode structure.

SUMMARY OF THE INVENTION

This invention relates to a method of fabrication used for semiconductor integrated circuit devices, and more specifically to the formation of high capacitance, less than 0.13 micron metal-insulator-metal capacitors, metal resistors and metal interconnects, formed simultaneously using damascene processing, eliminating an extra masking step.

This new method, disclosed by the present invention, has the key advantage of eliminating an extra masking step. This new method overcomes several current obstacles that exist in the fabricate MIM capacitors in the BEOL, back end of line, namely: (a) the use of two or more photo-masks to make <0.13 um MIM capacitors, (b) undulated copper surfaces, when dielectrics are deposited directly upon it, resulting in poor reliability, (c) for dielectric deposition directly on the bottom copper electrode plate, there are particles generation concerns during etching, when attempting an etch stop on the bottom plate Cu/IMD layers, and finally, (d) dishing during CMP occurs when large copper MIM plates are required, with subsequent capacitance matching problems. The new integrated method over comes all the above obstacles and simultaneously forms MIM capacitors, metal resistors and metal interconnects using damascene processing throughout.

The present invention teaches a process for the formation of a MIM capacitor, a metal resistor, and copper BEOL interconnect wiring and eliminates an extra masking step by using the combination of damascene processing and chemical mechanical polishing, CMP. A brief outline of the key processing steps follows below:

a) form bottom MIM trench openings and other metal line openings in an intermetal dielectric, IMD. (MASK #1, PHOTO #1)

b) fill trenches openings with metal barrier and copper, planarizing with CMP, forming bottom MIM and interconnects c) form shallow trench openings in a thin IMD, over existing bottom MIM and interconnects, same pattern as MASK #1. (MASK #1, PHOTO #2)

d) form bottom plate barrier layers in shallow trench openings and planarize surface by CMP.

e) form high dielectric constant insulator over thin IMD and patterned barrier layers.

f) form top metal for MIM, top interconnects, metal resistors over high dielectric constant insulator. (MASK #2, PHOTO #3) This completes the formation of the MIM capacitor, the resistor part of the metal resistor, and bottom interconnection wiring.

Therefore, in the above key processing steps, are shown the formation of high capacitance, less than 0.13 micron metal-insulator-metal capacitors, metal resistors and metal interconnects, which are all formed simultaneously using damascene processing, eliminating an extra masking step. The remainder of the processing involves encapsulation, packaging and electrical contact to the above devices. Therefore, from this point on in the process, BEOL, back end of line, processing is primarily focused on encapsulating the devices for electrical isolation and packaging, and making electrical contact through contact vias and trenches to the MIM capacitors and metal resistors. The key parts of the MIM capacitors and metal resistors have been formed with only two photo masks and three photolithography processing steps.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

This invention relates to a method of fabrication used for semiconductor integrated circuit devices, and more specifically to the formation of high capacitance, less than 0.13 micron metal-insulator-metal capacitors, metal resistors and metal interconnects, formed simultaneously using only one additional mask reticle to form both MIM capacitor and resistor, simultaneously.

This new method, disclosed by the present invention, has the key advantage of eliminating an extra masking step. This new method overcomes several current obstacles that exist in the fabricate MIM capacitors in the BEOL, back end of line, namely: (a) the use of two or more photo-masks to make <0.13 um MIM capacitors, (b) undulated copper surfaces, when dielectrics are deposited directly upon it, resulting in poor reliability, (c) for dielectric deposition directly on the bottom copper electrode plate, there are particles generation concerns during etching, when attempting an etch stop on the bottom plate Cu/IMD layers, and finally, (d) dishing during CMP occurs when large copper MIM plates are required, with subsequent capacitance matching problems. The new integrated method over comes all the above obstacles and simultaneously forms MIM capacitors, metal resistors and metal interconnects using damascene processing throughout.

Figure 1:
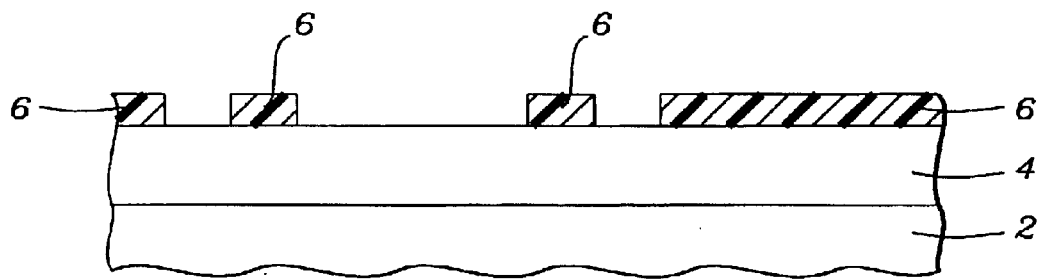
FIGS. 1 through 3 are schematic cross-sectional representations of damascene processing, which can be either a single or dual damascene process, and in addition, can be any conventional "standard" BEOL interconnect scheme.
Figure 2:
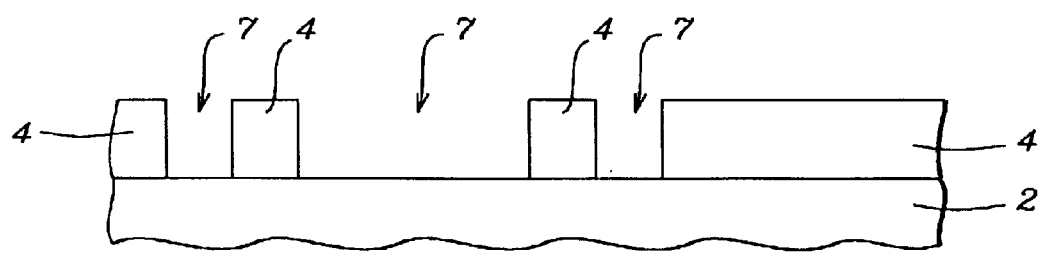
Figure 3:
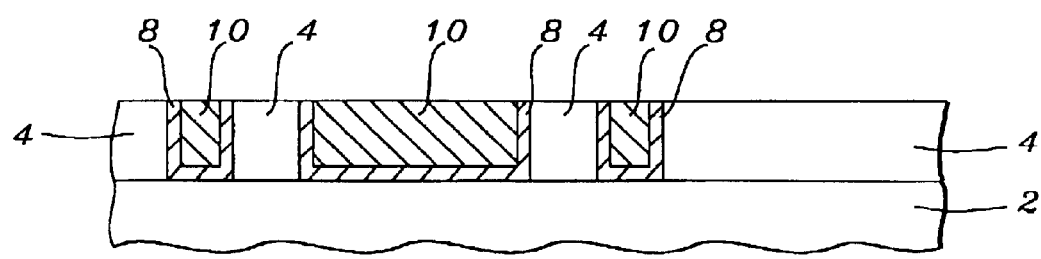

With reference to FIGS. 1 through 3, these sketches are schematic cross-sectional representations of damascene processing, which can be either a single or dual damascene process. In addition, FIGS. 1 through 3 can be any conventional "standard" BEOL interconnect scheme.

Referring to FIG. 1, which in cross-sectional representation illustrates the mask and patterning of an IMD, intermetal dielectric layer, to form a subsequent MIM bottom plate (shown in FIG. 3), of a metal-insulator-metal capacitor, as well as, others metal interconnect wiring lines. Again, referring to FIG. 1, Photo MASK #1 forms the pattern of photoresist 6 (PHOTO STEP #1), for the subsequent formation of trenches (shown in FIG. 2). The substrate 2 in FIG. 1 is a semiconductor substrate with active device therein and provided with an insulating layer or layer thereon. Moreover, the semiconductor substrate includes semiconductor device structures such as gate electrodes and source/drain regions and multiple levels of metal interconnections. An intermetal dielectric layer 4, IMD, is deposited on the substrate. Photo resist 6 is deposited and patterned over the intermetal dielectric layer 4.

Referring to FIG. 2, which in cross-sectional representation illustrates the formation of trenches or trench openings 7. This is accomplished by anisotropically etching the intermetal dielectric layer 4, in the exposed regions, as shown by the photoresist 6 patterned in FIG. 1.

Referring to FIG. 3, which in cross-sectional representation illustrates the formation of bottom copper metal electrode plates, in MIM capacitors, as well as, other copper metal interconnection lines and wiring. First a metal diffusion barrier layer 8 is deposited over the intermetal dielectric layer 4 and over the substrate 2. This barrier layer 8 is very thin and difficult to illustrate. Next, a thin copper seed layer 8 is deposited over the barrier layer. These two aforementioned layers, barrier and seed layer are thin and difficult to illustrate. Next, thick copper layer 10 is electrochemically plated on the copper seed forming an excess of copper on the surface on the IMD. This excess copper is removed from the surface, as well as, the seed and barrier materials, by planarization using chemical mechanical polishing, CMP. By this CMP process, bottom copper metal electrode plates and interconnect wiring are formed.

There are many methods that can be applied to form the first metal electrode layer, 10, in FIG. 3. The first metal electrode layer can be selected from group consisting of metals and metal alloys with high conductivity, such as, copper, copper alloys, TiN, Ta, TaN, AlCu, Al, Ti and W forming a MIM bottom metal plate deposited by following methods depending on the aspect ratio of trenches, selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from tens to thousands of Angstroms.

Figure 4:
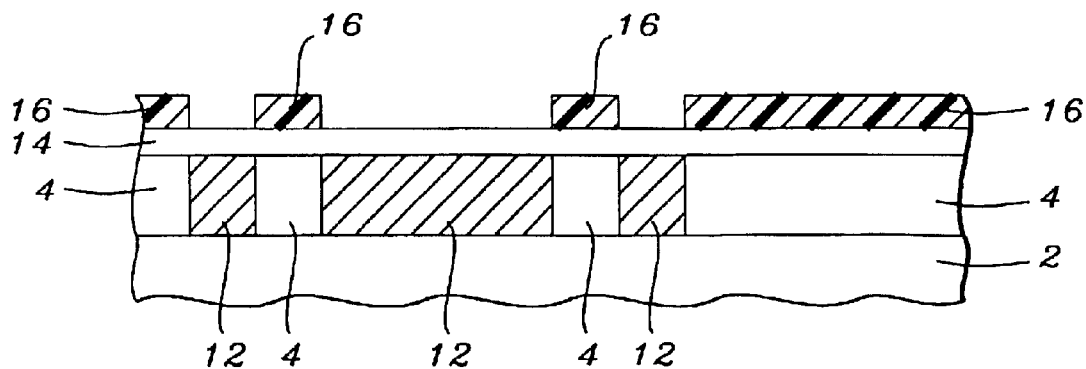
FIGS. 4 through 8 are schematic cross-sectional representations of preferred embodiments of the present invention.
Figure 5:
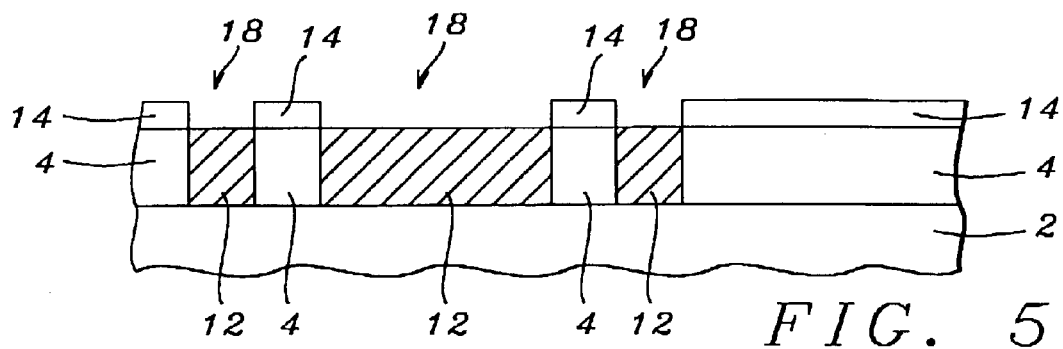

Referring to FIG. 4, which in cross-sectional representation illustrates the mask and patterning of a thin IMD, 14 intermetal dielectric layer, to form a subsequent shallow trenches 18, or trench openings (shown in FIG. 5). Again, referring to FIG. 4, Photo MASK #1 is used again to pattern photoresist 16 (PHOTO STEP #2), for the subsequent formation of shallow trenches (shown in FIG. 5). First, a thin intermetal dielectric layer 14, IMD, is deposited over the interlevel dielectric layer 4 and over the copper assembly layers 12, which consists of barrier, seed and thick copper. The thin intermetal dielectric layer 14, IMD, is comprised of a thickness range between 500 to 2,000 Angstroms. Next, photo resist 16 is deposited and patterned (duplicating the photo resist pattern shown in FIG. 1) over specific regions of the intermetal dielectric layer 4, and thus exposing specific regions of the thin intermetal dielectric layer which are over copper 12 regions, for subsequent isotropic etching, as shown in FIG. 5.

A special note with regard to possible mask misalignment in the above processing step, that is, in reference to FIG. 4, Photo MASK #1 that is used again to pattern photoresist 16 (PHOTO STEP #2), for the subsequent formation of shallow trenches, shown in FIG. 5. Note, that an oversized mask is preferred to an undersized mask because an undersized mask results in narrow metal lines, possibly affecting device performance. However, if metal bridging defects are a concern, then an undersized mask is preferred. In conclusion, if mask misalignment is a concern, slightly oversize or undersize can be achieve by applying different masking exposure conditions, depending on electrical device requirements. Note, no addition reticles are needed for this step. The general mask guidelines are: oversize features can be >0.2 microns per side, and undersize features can be <0.2 microns per side.

Referring to FIG. 5, which in cross-sectional representation illustrates the formation of shallow trenches 18, or shallow trench openings, in the thin intermetal dielectric layer 14. This is accomplished by anisotropically etching the thin intermetal dielectric layer 14, in the exposed regions, as shown by the photoresist 16 patterned in FIG. 4. Again, referring to FIG. 5, the etching process stops on the exposed copper 12 regions, fully forming the shallow trenches 18, or shallow trench openings.

Figure 6:
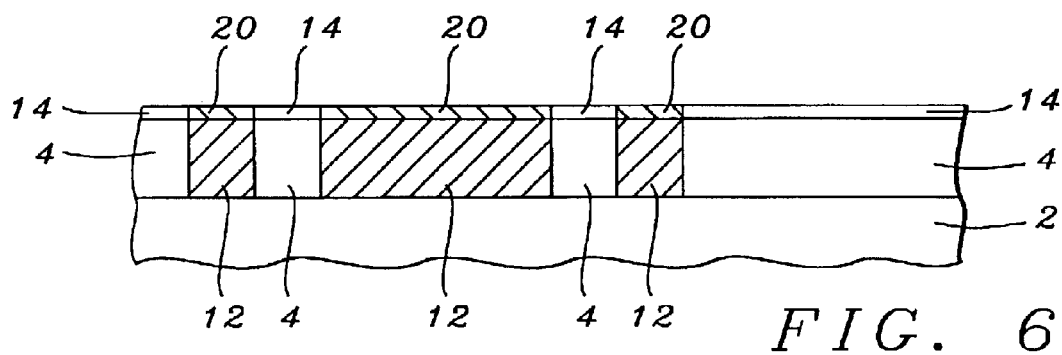

Referring to FIG. 6, which in cross-sectional representation illustrates several key processing steps of the present invention. Thin bottom plate barriers 20 are formed in the shallow trench openings. These barriers are deposited over thin intermetal dielectric layer 14 and over the exposed copper assembly 12. The surface of the intermetal dielectric layer 14 is planarized by chemical mechanical polish, CMP, and the barrier material is removed from the surface forming inlaid barriers 20 over the copper assembly 12. The thickness of the barrier 20 after chemical mechanical polishing, CMP, is approximately less than 500 Angstroms in thickness. The barrier layer is selected from the group consisting of Ta, Al, W, TaN, TiN, and metals that are compatible with copper interconnect process flow. The barrier layer can be deposited by following methods, selected from the group consisting of chemical vapor deposition CVD, physical vapor deposition PVD, atomic layer deposition ALD, and molecular beam epitaxy chemical vapor deposition MOCVD, deposited in a thickness range from 500 to 2000 Angstroms.

The main advantages of the above barrier layer 20, are the following: a) the bottom copper plate electrodes and copper interconnection wiring layer are made planar by the barrier layer 20, thus avoiding a deleterious, undulated copper surface, c) in subsequent top plate MIM etches, all the bottom copper metal is protected by the barrier layer 20, thus avoiding potential particle problems, d) the MIM capacitor and subsequent metal resistor is formed at Cu BEOL by using only one extra mask.

Figure 7A:
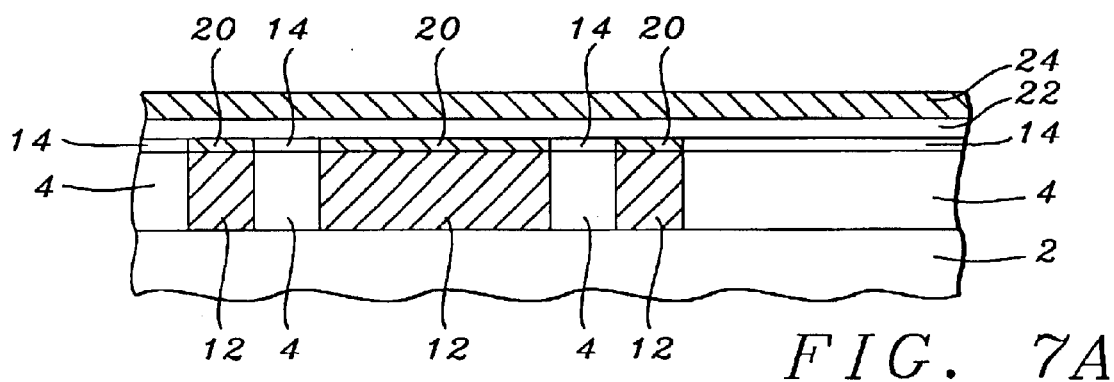

Referring to FIG. 7A, which in cross-sectional representation illustrates the deposition of the MIM, high K dielectric material 22, high dielectric constant dielectric insulator and the deposition of the MIM top plate metal electrode 24. The MIM, high K dielectric material 22, high dielectric constant dielectric insulator forming the capacitor dielectric insulator with high dielectric constant material or materials is selected from the group consisting of $Ta_2O_5$, $HfO_2$, $ZrO_2$, $TiO_2$, $Al_2O_3$, SiN, SiC, and TaON, formed by Atomic Layering Chemical Vapor Deposition techniques, ALCVD, with thickness ranging from tens to thousands of Angstroms, under low temperature deposition conditions. The MIM top plate metal electrode 24 is selected from the group consisting of copper, copper alloys, TiN, Ta, TaN, AlCu, Al, Ti and W. The process sequence is as follows: Firstly, deposit the MIM, high K dielectric material 22, high dielectric constant dielectric insulator over the patterned thin intermetal dielectric layer 14, IMD, and the patterned barrier layer 20. Secondly, deposit the MIM top plate metal electrode 24 over the MIM, high. K dielectric material 22.

Figure 7B:
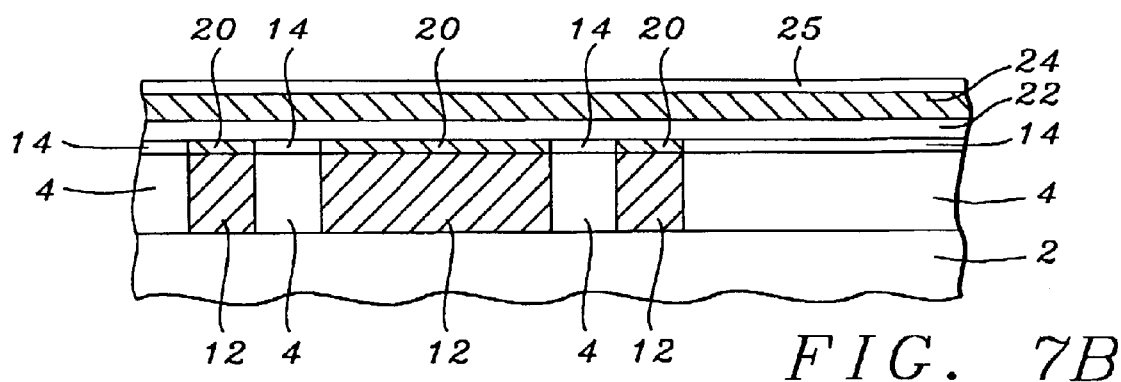

Referring to FIG. 7B, which in cross-sectional representation illustrates an option process step, namely, the deposition of: the MIM, high K dielectric material 22, high dielectric constant dielectric insulator, the deposition of the MIM top plate metal electrode 24, including an optional etch stop layer 25, deposited over the MIM top plate metal electrode 24. This additional optional etch stop layer 25 may be required for controlling the subsequent via-etch-stop, due to differences in step height caused by MIM top plate metal electrode 24. Furthermore, this additional optional etch stop layer 25 is selected from the group consisting of SiN, and SiC, with thickness from approximately 100 to 1000 Angstroms. Thus optional etch stop is required: if the subsequent via etch selectivity of the MIM top plate metal electrode and a subsequent thick IMD, intermetal dielectric layer, is poor.

Referring to FIG. 3, which in cross-sectional representation illustrates the mask and patterning of photoresist 26 to form the top MIM plate electrodes and the metal resistor, R, from the top the MIM top plate metal electrode material 24, continuing with the standard process of the present invention, as shown in FIG. 7A. Firstly, photoresist 26 is formed and patterned over the top MIM electrode material 24. This is MASK #2, PHOTO STEP #3, in the process.

With reference to FIGS. 9 through 12, these sketches are schematic cross-sectional representations of the simultaneous formation of both the metal resistor and the MIM top plate electrode. In addition, contact vias to these devices are formed therein. Note, these are key preferred embodiments of the present invention that are described in detail below.

Figure 8:
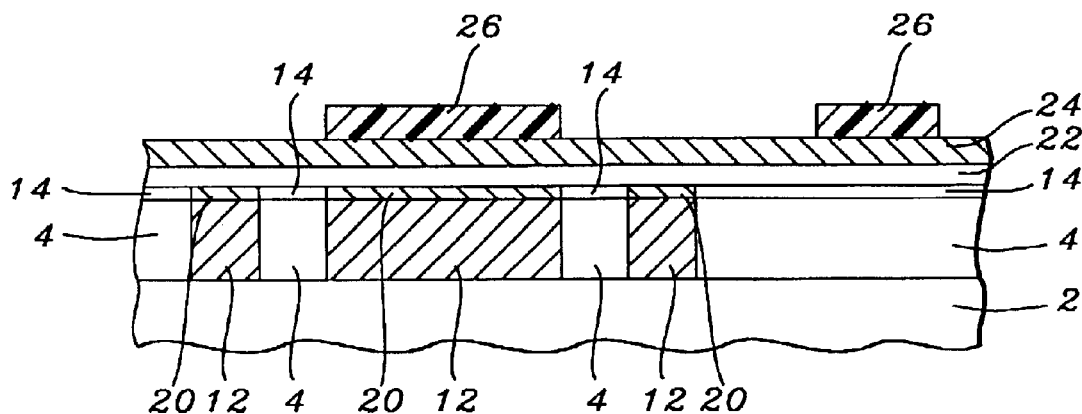
Figure 9:
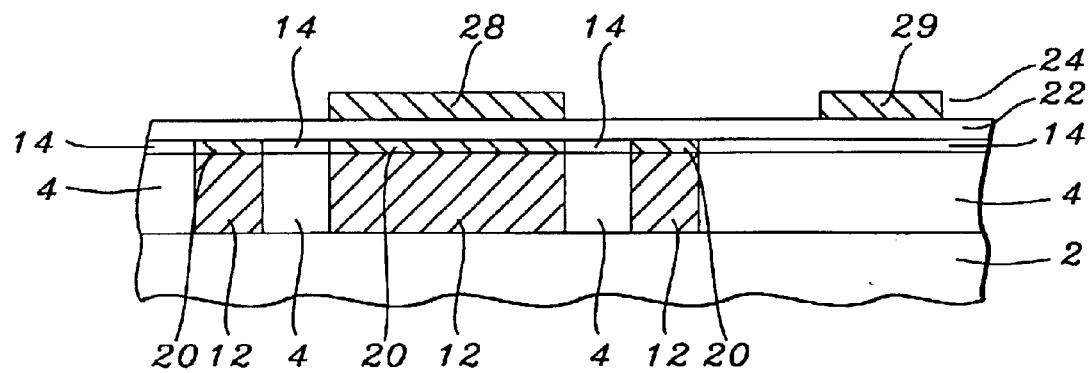
FIGS. 9 through 12 are schematic cross-sectional representations of the simultaneous formation of both the metal resistor and the MIM top plate electrode, and contact vias formed therein, key preferred embodiments of the present invention.

Referring to FIG. 9, which in cross-sectional representation illustrates the forming of the top metal MIM electrodes and top metal interconnect wiring, for simplicity the metal layers are designated 28, and the metal resistor 29, R. This metal patterning is accomplished by using the photoresist 26 patterning in FIG. 8, and etching the exposed metal, and furthermore, stopping the etch on the MIM, high K dielectric material 22, as shown in FIG. 9. This completes the formation of the MIM capacitor 28, the resistor part of the metal resistor 29, and bottom interconnection wiring. As an alternate or optional processing etch step, a one-step etch may be performed by etching away both the exposed metal and the high dielectric, and over-etching midway through the thin intermetal dielectric layer 14, in the exposed regions. Both oversize or undersize sides or features of the MIM top plate may be required, depending on electrical design considerations.

There are many methods that can be applied to form the second metal electrode layer, 28, in FIG. 9; and simultaneously, the metal resistor 29. An important aspect of the present invention method is that the scheme described herein allows for great flexibility in the choice of both the dielectric and metal for both the MIM top plate and the metal resistor. The second metal electrode layer and metal resistor can be selected from group consisting of metals and metal alloys with high conductivity, such as, copper, copper alloys, TiN, Ta, TaN, AlCu, Al, Ti and W forming a MIM top metal plate deposited by following methods depending on the aspect ratio of trenches, selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from tens to thousands of Angstroms.

With the completion of the formation of the MIM capacitor and the resistor part of the metal resistor, the following process step involve encapsulation, packaging and electrical contact to the above devices. Therefore, from this point on in the process, BEOL, back end of line, processing is primarily focused on encapsulating the devices for electrical isolation and packaging, and making electrical contact through contact vias and trenches to the MIM capacitors and metal resistors. The key parts of the MIM capacitors and metal resistors have been formed with only two photo masks and three photolithography processing steps.

Figure 10:
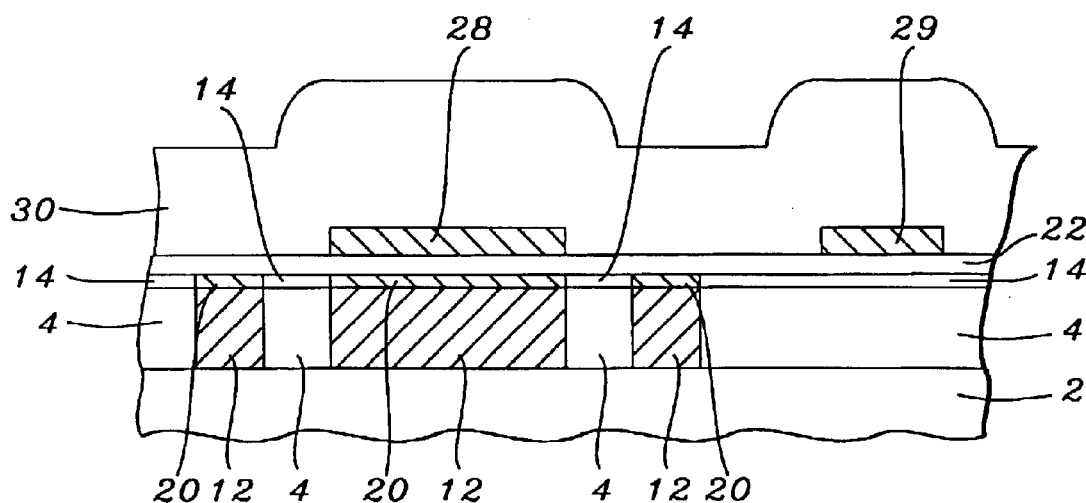

Referring to FIG. 10, which in cross-sectional representation illustrates the deposition of a thick IMD, intermetal dielectric layer 30, over the top metal MIM electrodes and top metal interconnect wiring, for simplicity the metal layers are designated 28. The purpose of the thick IMD, intermetal dielectric layer 30, is to flatten or make planar the surface over the top metal MIM electrodes and top metal interconnect wiring, designated 28. The thick IMD, intermetal dielectric layer 30, is a low dielectric constant material selected from the group consisting of: SiN, SiO, spin-on-glass SOG, PE plasma enhanced TEOS, tetraethoxysilane deposition, halogenated SiO, fluorinated silicate glass FSG, CORAL, black diamond, deposited by the following methods selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from 1000 to 10000 Angstroms. The thick IMD, intermetal dielectric layer 30, is planarized by chemical mechanical polishing, CMP, and the planar surface is illustrated in the next figure, FIG. 11. Note, that this planarization step described above is not required when the topography introduced by the MIM top-plate and metal resistor is slight, and does not cause topography step height problems with subsequent process steps, such as, masking, oxide etch, and metal fill.

Figure 11:
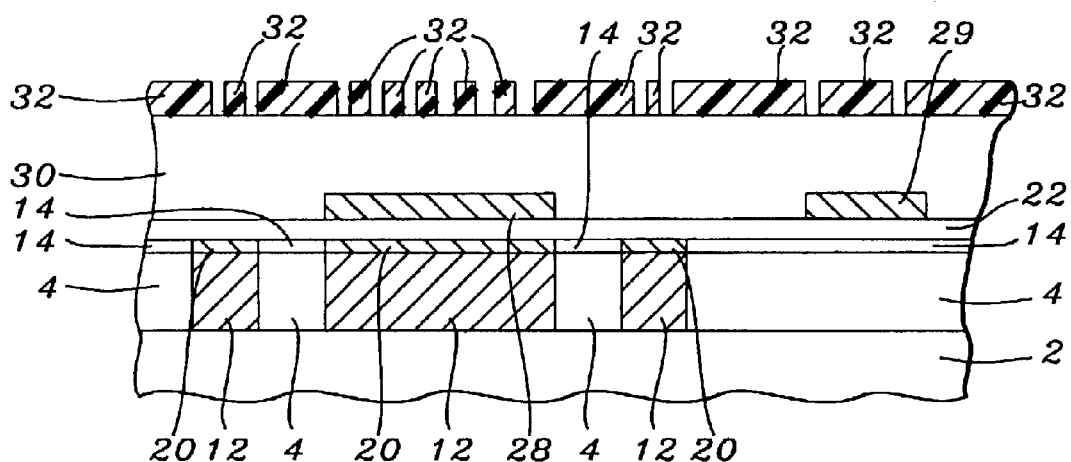

Referring to FIG. 11, which in cross-sectional representation illustrates the masking and patterning of photoresist 32, which will form via openings. Note, the exposed photoresist regions are aligned with device features below. These exposed regions will form electrical contact vias in the subsequent etch step, illustrated in the next figure, FIG. 12. The photoresist is formed over the planarized thick IMD, intermetal dielectric layer 30. This represent the third masking and the fourth photo step, MASK #3, PHOTO STEP #4.

Figure 12:
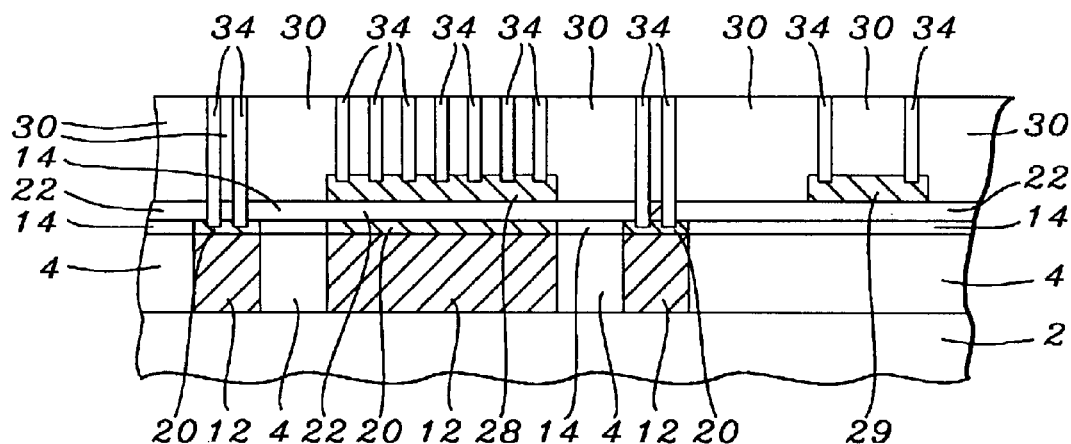

Referring to FIG. 12, which in cross-sectional representation illustrates the reactive ion dry etching of the contact via openings 34. Again note, that the exposed photoresist regions were aligned with device features below. Now, after etching, exposed regions will form contact via openings 34 to the device features below. All the contact via openings 34 are "empty" and cleared during etching due to the etch selectivity difference between the metal and low k dielectric material. The vias depth differences at MIM capacitor and normal metal lines are not a problem. Note, some via openings during etching, etch stop at or on the MIM bottom plate's barrier layer 20.

Figure 13:
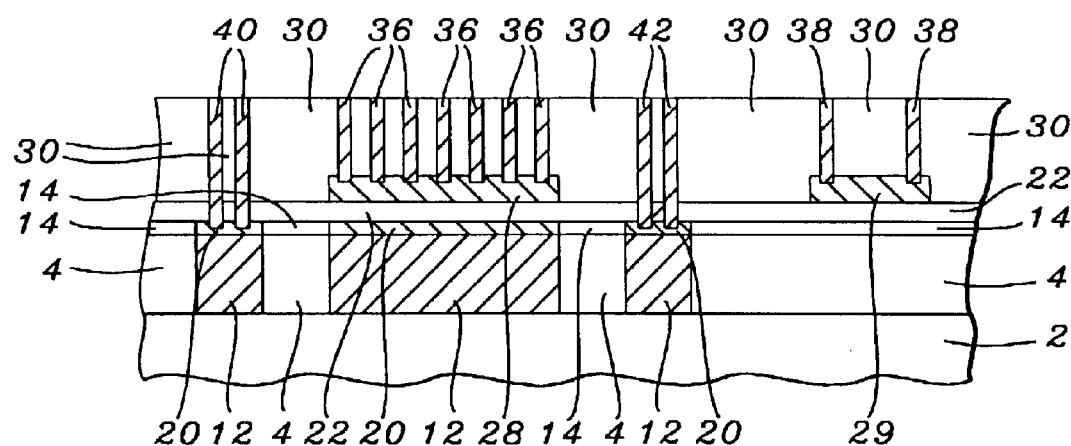
FIGS. 13 through 16 are schematic cross-sectional representations of preferred embodiments of the present invention.

Referring to FIG. 13, which in cross-sectional representation illustrates the next set of processing steps, the filling of the via openings with barrier layer and copper metals the barrier and copper metal set or assembly designated 36 for contact vias to the top MIM electrode. Note, barrier layer is too thin to sketch into vias. The barrier and copper metal set or assembly designated: for contact vias to the top metal resistor electrode 38, and for contact vias to the bottom metal resistor electrodes 40 and 42, respectively.

Figure 14:
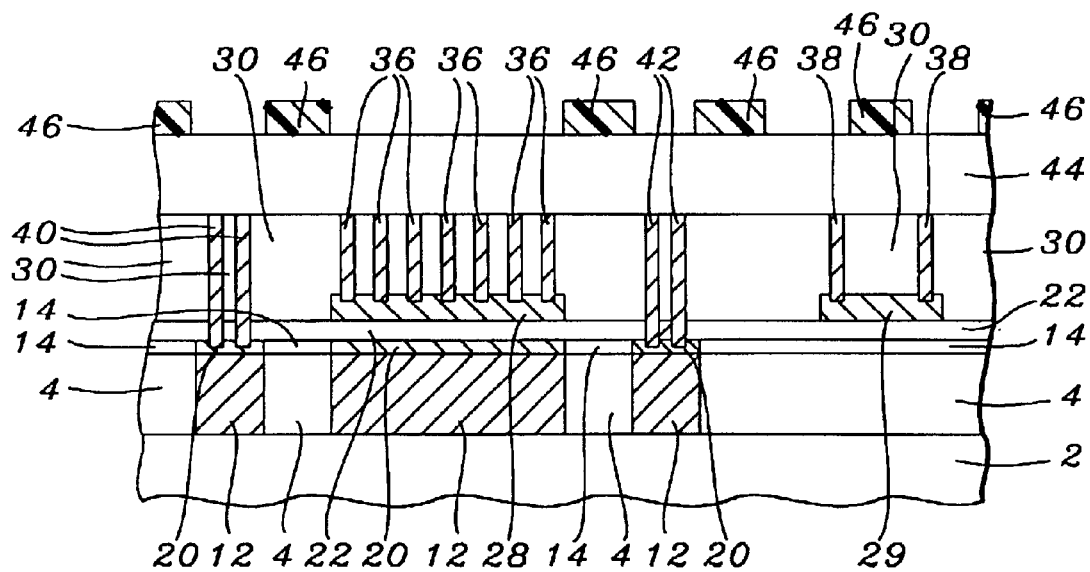

Referring to FIG. 14, which in cross-sectional representation illustrates the next set of processing steps in the BEOL, the deposition of a thick IMD, intermetal dielectric layer 44. Photoresist 46 is masked and patterned over the thick IMD, intermetal dielectric layer 44, for the purpose of forming trench openings in the intermetal dielectric layer in subsequent process steps. This marks the approach of the final processing steps, namely the subsequent filling of the trench openings with top metal lines. The thick IMD, intermetal dielectric layer 44, is a low dielectric constant material selected from the group consisting of: SiN, SiO, spin-on-glass SOG, PE plasma enhanced TEOS, tetraethoxysilane deposition, halogenated SiO, fluorinated silicate glass FSG, CORAL, black diamond, deposited by the following methods selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from hundreds to thousands of Angstroms. This step represents the fourth mask and the fifth photo step, MASK #4, PHOTO STEP #5 (Note, the opposite photoresist pattern, positive/negative, to the photoresist 26 in FIG. 8.) These are final photolithography processing steps, thus formation of MIM capacitor, metal resistor, and copper BEOL interconnect wiring is accomplished by using only one extra mask.

Figure 15:
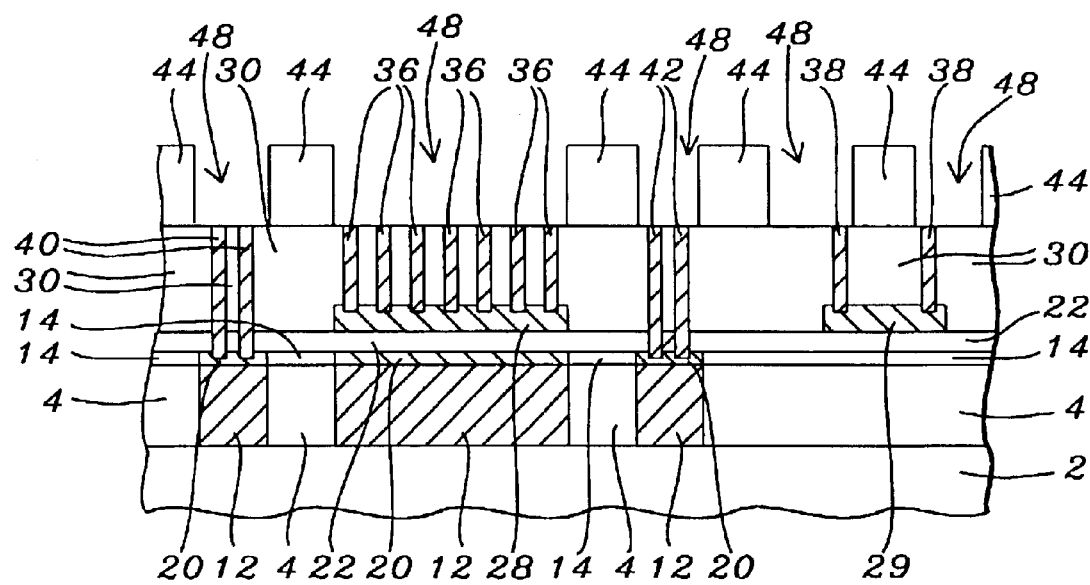

Referring to FIG. 15, which in cross-sectional representation illustrates the forming of the trench openings 48 by etching the intermetal dielectric layer 44. Subsequently, these trench openings 48 are to filled with top metal forming top metal lines.

Figure 16:
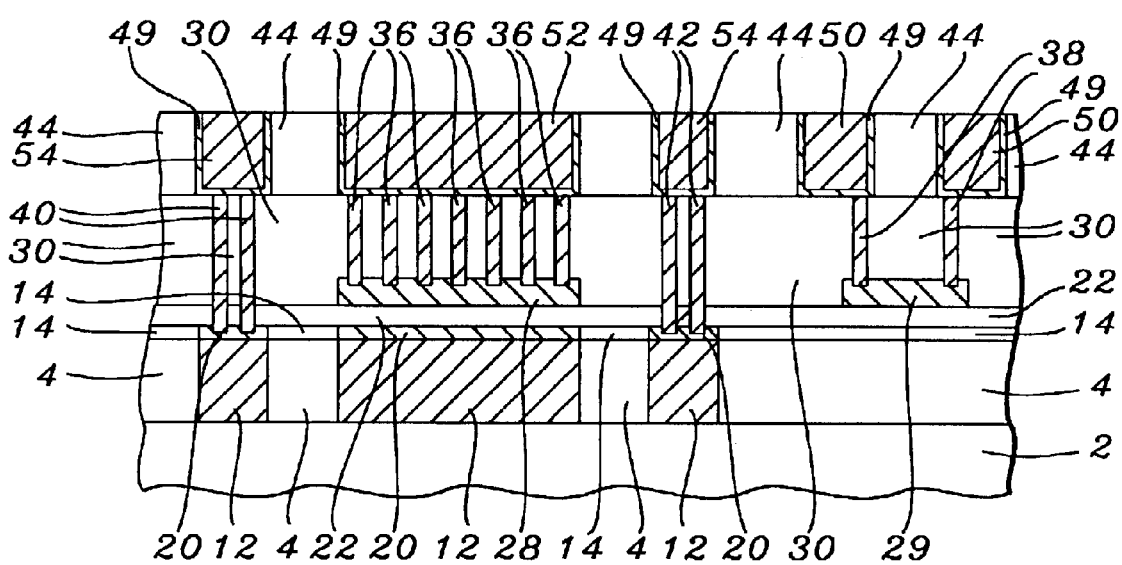

Referring to FIG. 16, which in cross-sectional representation illustrates the filling of the trench openings with barrier layers 49 lining the trenches and copper metal contact trenches 50, 52 and 54. The copper metal contact trenches 50 contact vias to opposite ends of a top metal resistor. The copper metal contact trench 52 contact vias to top metal MIM capacitor electrode. The copper metal contact trenches 54 contact vias to bottom metal interconnect wiring. Thus, formation of a MIM capacitor, a metal resistor, and copper BEOL interconnect wiring is accomplished by using only one extra mask.

Another important capacitor application of the present invention is in integrated circuits that use anti-fuse devices, in field-programmable gate arrays, FPGA. In an anti-fuse device, a metal-insulator-metal capacitor, MIM, is normally in an "open" circuit state, as a capacitor. However, after a high breakdown voltage or high breakdown field is applied to the capacitor, the capacitor's dielectric breaks down and changes to an irreversible "short" circuit state, or closed contact device. Therefore, the anti-fuse, MIM device has binary electrical states of "open", and "closed" circuit states. In the present invention described herein, for fabrication of an anti-fuse device, the metal-insulator-metal capacitor's surface area dimensions are formed, as small as, the size of the via, and the insulating dielectric material for the capacitor is of low dielectric constant material, comprised of amorphous silicon. Furthermore, the thickness of all the layers and the dielectrics specified herein, for the metal-insulator-metal capacitor, MIM, remain the same and unchanged for the anti-fuse, MIM application described above.

While the invention has been particularly shown and described with reference to the preferred embodiments thereof, it will be understood by those skilled in the art that various changes in form and details may be made without departing from the spirit and scope of the invention.

What is claimed is:

1. A method for fabricating metal-insulator-metal capacitors, MIM, metal resistors, and copper back end of line interconnect wiring, comprising:

providing a first intermetal dielectric layer overlying a semiconductor substrate;

forming bottom MIM trench openings and other metal line openings in the first intermetal dielectric layer patterning using a first mask, photoresist process one;

forming a first metal MIM electrode and other metal interconnect wiring lines filling said openings;

forming shallow trench openings in a thin second intermetal dielectric layer, over existing first metal MIM electrode and interconnects, patterning using the first mask again, photoresist process two;

forming a bottom plate barrier layer in the shallow trench openings and planarizing back the top surface, leaving the bottom plate barrier layer in the trench;

forming a high dielectric constant insulator layer over the thin second intermetal dielectric layer and bottom plate barrier layer;

forming a second metal MIM electrode, interconnects, and metal resistors over the high dielectric constant insulator layer, patterning using a second mask, photoresist process three, thus completing the MIM capacitors, metal resistors and copper wiring.

2. The method of claim 1, wherein said semiconductor substrate includes semiconductor device structures such as gate electrodes and source/drain regions.

3. The method of claim 1, wherein said semiconductor substrate includes semiconductor device structures such as gate electrodes, source/drain regions and multiple levels of metal interconnections.

4. The method of claim 1, wherein said first and second intermetal dielectric layers are a low dielectric constant material or materials selected from the group consisting of: SiN, SiO, spin-on-glass SOG, PE plasma enhanced TEOS, tetraethoxysilane deposition, halogenated SiO, fluorinated silicate glass FSG, black diamond, deposited by the following methods selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from 1000 to 10000 Angstroms.

5. The method of claim 1, wherein said first metal electrode layer is selected from group consisting of metals and metal alloys with high conductivity, such as, copper, copper alloys, TiN, Ta, TaN, AlCu, Al, Ti and W forming a MIM bottom metal plate deposited by following methods depending on the aspect ratio of trenches, selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from tens to thousands of Angstroms.

6. The method of claim 1, wherein said capacitor dielectric insulator with high dielectric constant material or materials is selected from the group consisting of $Ta_2O_5$, $HfO_2$, $ZrO_2$, $TiO_2$, $Al_2O_3$, SiN, SiC, and TaON, formed by Atomic Layering Chemical Vapor Deposition techniques, ALCVD, with thickness ranging from tens to thousands of Angstroms, under low temperature deposition conditions.

7. The method of claim 1, wherein said metal barrier layers are selected from the group consisting of Ta, Al, TaN, TiN, and metals that are compatible with copper interconnect process flow, with the thickness of the barrier after chemical mechanical polishing CMP, being approximately less than 500 Angstroms in thickness, deposited by following methods, selected from the group consisting of chemical vapor deposition CVD, physical vapor deposition PVD, atomic layer deposition ALD, and molecular beam epitaxy chemical vapor deposition MOCVD, and deposited in a thickness range from 500 to 2000 Angstroms.

8. The method of claim 1, wherein said second metal electrode layer is selected from group consisting of metals and metal alloys with high conductivity, such as, copper, copper alloys, TiN, Ta, TaN, AlCu, Al, Ti and W forming a MIM top metal plate deposited by following methods depending on the aspect ratio of trenches, selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from tens to thousands of Angstroms.

9. The method of claim 1, wherein the first MIM metal electrode is comprised of copper and conducting barrier, and planarized by chemical mechanical polishing.

10. The method of claim 1, wherein said first MIM metal electrode layer is formed in a damascene opening in the first intermetal dielectric layer and then planarized by chemical mechanical polishing, forming inlaid embedded metal electrodes in the first intermetal dielectric layer.

11. A method for fabricating metal-insulator-metal capacitors, MIM, metal resistors, and copper back end of line interconnect wiring, and electrical contacts therein, comprising:

providing a first intermetal dielectric layer overlying a semiconductor substrate;

forming bottom MIM trench openings and other metal line openings in the first intermetal dielectric layer patterning using a first mask, photoresist process one;

forming a first metal MIM electrode and other metal interconnect wiring lines filling said openings;

forming shallow trench openings in a thin second intermetal dielectric layer, over existing first metal MIM electrode and interconnects, patterning using the first mask again, photoresist process two;

forming a bottom plate barrier layer in the shallow trench openings and planarizing back the top surface, leaving the bottom plate barrier layer in the trench;

forming a high dielectric constant insulator layer over the thin second intermetal dielectric layer and bottom plate barrier layer;

forming a second metal MIM electrode, interconnects, and metal resistors over the high dielectric constant insulator layer, patterning using a second mask, photoresist process three, forming MIM capacitors, metal resistors and copper interconnect wiring;

depositing a thick third intermetal dielectric layer over the second metal MIM electrode, interconnects, and metal resistors and over the high dielectric constant insulator layer;

planarizing the third intermetal dielectric layer by chemical mechanical polishing;

forming via openings which connect to both first and second metal, patterning using a third mask, photoresist process four;

forming a metal barrier layer lining the via openings and forming copper metal filling the via openings, forming copper contact vias to both first second metal;

depositing a thick fourth intermetal dielectric layer over copper contact vias and over the third intermetal dielectric layer;

forming large trench openings in the fourth intermetal dielectric layer over the copper contact vias, patterning using a fourth mask, photoresist process five;

forming a metal barrier layer lining the large trench openings and forming copper metal filling the via openings, planarizing the surface by chemical mechanical polish, thus forming electrical contacts through the contact vias below, to the metal-insulator-metal capacitors, MIM, metal resistors, and copper back end of line interconnect wiring.

12. The method of claim 11, wherein said semiconductor substrate includes semiconductor device structures such as gate electrodes and source/drain regions.

13. The method of claim 11, wherein said semiconductor substrate includes semiconductor device structures such as gate electrodes, source/drain regions and multiple levels of metal interconnections.

14. The method of claim 11, wherein said first and second intermetal dielectric layers are a low dielectric constant material or materials selected from the group consisting of: SiN, SiO, spin-on-glass SOG, PE plasma enhanced TEOS, tetraethoxysilane deposition, halogenated SiO, fluorinated silicate glass FSG, black diamond, deposited by the following methods selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from 1000 to 10000 Angstroms.

15. The method of claim 11, wherein said first metal electrode layer is selected from group consisting of metals and metal alloys with high conductivity, such as, copper, copper alloys, TiN, Ta, TaN, AlCu, Al, Ti and W forming a MIM bottom metal plate deposited by following methods depending on the aspect ratio of trenches, selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from tens to thousands of Angstroms.

16. The method of claim 11, wherein said capacitor dielectric insulator with high dielectric constant material or materials is selected from the group consisting of $Ta_2O_5$, $HfO_2$, $ZrO_2$, $TiO_2$, $Al_2O_3$, SiN, SiC, and TaON, formed by Atomic Layering Chemical Vapor Deposition techniques, ALCVD, with thickness ranging from tens to thousands of Angstroms, under low temperature deposition conditions.

17. The method of claim 11, wherein said metal barrier layers are selected from the group consisting of Ta, Al, TaN, TiN, and metals that are compatible with copper interconnect process flow, with the thickness of the barrier after chemical mechanical polishing CMP, being approximately less than 500 Angstroms in thickness, deposited by following methods, selected from the group consisting of chemical vapor deposition CVD, physical vapor deposition PVD, atomic layer deposition ALD, and molecular beam epitaxy chemical vapor deposition MOCVD, and deposited in a thickness range from 500 to 2000 Angstroms.

18. The method of claim 11, wherein said second metal electrode layer is selected from group consisting of metals and metal alloys with high conductivity, such as, copper, copper alloys, TiN, Ta, TaN, AlCu, Al, Ti and W forming a MIM top metal plate deposited by following methods depending on the aspect ratio of trenches, selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from tens to thousands of Angstroms.

19. The method of claim 11, wherein the first MIM metal electrode is comprised of copper and conducting barrier, and planarized by chemical mechanical polishing.

20. The method of claim 11, wherein said first MIM metal electrode layer is formed in a damascene opening in the first intermetal dielectric layer and then planarized by chemical mechanical polishing, forming inlaid embedded metal electrodes in the first intermetal dielectric layer.

21. The method of claim 11, further comprising forming an optional etch stop layer over said second metal MIM electrode, interconnects, and metal resistors.

22. A method for fabricating metal-insulator-metal capacitors, MIM, metal resistors, and copper back end of line interconnect wiring, using only one extra mask comprising:

providing a first intermetal dielectric layer overlying a semiconductor substrate;

forming a first metal MIM electrode and other metal interconnect wiring lines in a damascene process using a first mask, photoresist process one, in the first intermetal dielectric layer; forming a bottom plate barrier layer over existing first metal MIM electrode and interconnects patterning in a damascene process using the first mask again, photoresist process two, in a provided second intermetal dielectric layer;

forming a high dielectric constant insulator layer over the second intermetal dielectric layer and bottom plate barrier layer;

forming a second metal MIM electrode, interconnects, and metal resistors over the high dielectric constant insulator layer, patterning using a second mask, photoresist process three;

thus, forming MIM capacitors, metal resistors and copper interconnect wiring with only one extra mask.

23. The method of claim 22, wherein said semiconductor substrate includes semiconductor device structures such as gate electrodes and source/drain regions.

24. The method of claim 22, wherein said semiconductor substrate includes semiconductor device structures such as gate electrodes, source/drain regions and multiple levels of metal interconnections.

25. The method of claim 22, wherein said first and second intermetal dielectric layers are a low dielectric constant material or materials selected from the group consisting of:

SiN, SiO, spin-on-glass SOG, PE plasma enhanced TEOS, tetraethoxysilane deposition, halogenated SiO, fluorinated silicate glass FSG, black diamond, deposited by the following methods selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from 1000 to 10000 Angstroms.

26. The method of claim 22, wherein said first metal electrode layer is selected from group consisting of metals and metal alloys with high conductivity, such as, copper, copper alloys, TiN, Ta, TaN, AlCu, Al, Ti and W forming a MIM bottom metal plate deposited by following methods depending on the aspect ratio of trenches, selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from tens to thousands of Angstroms.

27. The method of claim 22, wherein said capacitor dielectric insulator with high dielectric constant material or materials is selected from the group consisting of $Ta_2O_5$, $HfO_2$, $ZrO_2$, $TiO_2$, $Al_2O_3$, SiN; SiC, and TaON, formed by Atomic Layering Chemical Vapor Deposition techniques, ALCVD, with thickness ranging from tens to thousands of Angstroms, under low temperature deposition conditions.

28. The method of claim 22, wherein said metal barrier layers are selected from the group consisting of Ta, Al, TaN, TiN, and metals that are compatible with copper interconnect process flow, with the thickness of the barrier after chemical mechanical polishing CMP, being approximately less than 500 Angstroms in thickness, deposited by following methods, selected from the group consisting of chemical vapor deposition CVD, physical vapor deposition PVD, atomic layer deposition ALD, and molecular beam epitaxy chemical vapor deposition MOCVD, and deposited in a thickness range from 500 to 2000 Angstroms.

29. The method of claim 22, wherein said second metal electrode layer is selected from group consisting of metals and metal alloys with high conductivity, such as, copper, copper alloys, TiN, Ta, TaN, AlCu, Al, Ti and W forming a MIM top metal plate deposited by following methods depending on the aspect ratio of trenches, selected from the group consisting of electrochemical plating, chemical vapor deposition CVD, physical vapor deposition PVD, atomic layer deposition ALD, and molecular beam epitaxy chemical vapor deposition MOCVD, and deposited in a thickness ranging from tens to thousands of Angstroms.

30. The method of claim 22, wherein said first MIM metal electrode layer is formed in a damascene opening in the first intermetal dielectric layer and then planarized by chemical mechanical polishing, forming inlaid embedded metal electrodes in the first intermetal dielectric layer.

31. The method of claim 22, wherein said first MIM metal electrode layer is formed in a damascene opening in the first intermetal dielectric layer and then planarized by chemical mechanical polishing, forming inlaid embedded metal electrodes in the first intermetal dielectric layer.

* * * * *